US012677698B2

(12) United States Patent
Shomura et al.

(10) Patent No.: US 12,677,698 B2
(45) Date of Patent: Jul. 7, 2026

(54) SEMICONDUCTOR DEVICE AND MANUFACTURING METHOD THEREOF

(71) Applicant: Kioxia Corporation, Tokyo (JP)

(72) Inventors: Masatoshi Shomura, Mie Mie (JP);
Tatsuo Migita, Nagoya Aichi (JP)

(73) Assignee: Kioxia Corporation, Tokyo (JP)

( * ) Notice: Subject to any disclaimer, the term of this
patent is extended or adjusted under 35
U.S.C. 154(b) by 799 days.

(21) Appl. No.: 17/930,688

(22) Filed: Sep. 8, 2022

(65) Prior Publication Data

US 2023/0411330 A1     Dec. 21, 2023

(30) Foreign Application Priority Data

Mar. 16, 2022    (JP) ................................. 2022-041598

(51) Int. Cl.
*H10W 90/00*        (2026.01)
*H10W 72/00*        (2026.01)
*H10W 72/20*        (2026.01)
*H10W 74/15*        (2026.01)
                (Continued)

(52) U.S. Cl.
CPC ............ *H10W 90/00* (2026.01); *H10W 72/01*
(2026.01); *H10W 72/01208* (2026.01);
                (Continued)

(58) Field of Classification Search
CPC ..................... H01L 2224/05575–05584; H01L
2224/05541–05548; H01L
2224/0556–05572; H01L
2224/05005–05009; H01L
2224/0501–05019; H01L 2224/0502–05027; H01L 2224/05073;
H01L 2224/05075–05084; H01L
2224/08165; H01L 2224/05025; H01L
2224/05087; H01L 2224/0509–05097;
(Continued)

(56) References Cited

U.S. PATENT DOCUMENTS 7,626,271 B2    12/2009  Watanabe
9,455,237 B2 *   9/2016  Uzoh ...................... H01L 24/03
                 (Continued)

FOREIGN PATENT DOCUMENTS

CN          101106116 A      1/2008

*Primary Examiner* — Julio J Maldonado
*Assistant Examiner* — Eric Manuel Mulero Flores
(74) *Attorney, Agent, or Firm* — Finnegan, Henderson,
Farabow, Garrett & Dunner, LLP

(57) ABSTRACT

A semiconductor device according to the present embodiment includes an insulation member, a columnar electrode, a member, and an electrode pad. The insulation member has a first face. The columnar electrode penetrates the insulation member in a direction approximately perpendicular to the first face. The columnar electrode has a columnar electrode member and a first metal layer of at least one layer which covers an outer circumference of the columnar electrode member and which extends until becoming exposed from the first face. The member is provided on the first face and is arranged so as to overlap with at least a part of the first metal layer that is exposed from the first face as viewed from a direction approximately perpendicular to the first face. The electrode pad is provided on the first face so as to cover the member and is electrically connected to the columnar electrode member.

14 Claims, 6 Drawing Sheets

(51) Int. Cl.
  *H10W 90/20*       (2026.01)
  *H10W 90/24*       (2026.01)

(52) U.S. Cl.
  CPC ........ *H10W 72/223* (2026.01); *H10W 72/232* (2026.01); *H10W 72/234* (2026.01); *H10W 72/235* (2026.01); *H10W 72/283* (2026.01); *H10W 72/877* (2026.01); *H10W 74/15* (2026.01); *H10W 90/20* (2026.01); *H10W 90/24* (2026.01); *H10W 90/724* (2026.01); *H10W 90/732* (2026.01); *H10W 90/734* (2026.01)

(58) Field of Classification Search
  CPC ... H01L 2224/0401; H01L 2224/05022; H01L 2224/05026; H01L 2224/05561–05562; H01L 2224/05563–05566; H10W 72/00; H10W 72/20; H10W 72/231237; H10W 20/423; H10W 20/425; H10W 20/40; H10W 20/455; H10W 20/211–233; H10W 72/981–987; H10W 72/931934
  See application file for complete search history.

(56) References Cited

U.S. PATENT DOCUMENTS

| | | | | |
|---|---|---|---|---|
| 10,998,282 | B2 | 5/2021 | Unruh et al. | |
| 2005/0218497 | A1* | 10/2005 | Komuro .............. | H10W 20/023 257/E23.008 |
| 2010/0044089 | A1* | 2/2010 | Shibuya ............ | H01L 23/49822 29/832 |
| 2011/0291268 | A1 | 12/2011 | Wang et al. | |
| 2012/0133048 | A1* | 5/2012 | Lee ................... | H01L 23/49816 257/774 |
| 2012/0235296 | A1* | 9/2012 | West ........................ | H01L 24/08 257/737 |
| 2015/0380310 | A1* | 12/2015 | Zhao ........................ | H01L 24/94 438/460 |
| 2016/0086874 | A1* | 3/2016 | Choi ...................... | H10W 20/20 257/774 |
| 2017/0062308 | A1* | 3/2017 | Choi ...................... | H10W 20/20 |
| 2022/0278024 | A1* | 9/2022 | Ding ................... | H01L 23/5283 |

* cited by examiner

SEMICONDUCTOR DEVICE AND MANUFACTURING METHOD THEREOF

CROSS REFERENCE TO RELATED APPLICATIONS

This application is based upon and claims the benefit of priority from the prior Japanese Patent Application No. 2022-041598, filed on Mar. 16, 2022, the entire contents of which are incorporated herein by reference.

FIELD

The embodiments of the present invention relate to a semiconductor device and a manufacturing method thereof.

BACKGROUND

A semiconductor package may be provided with an electrode pad to provide an electrical connection. The electrode pad desirably has high connection reliability.

DETAILED DESCRIPTION

Figure 1:
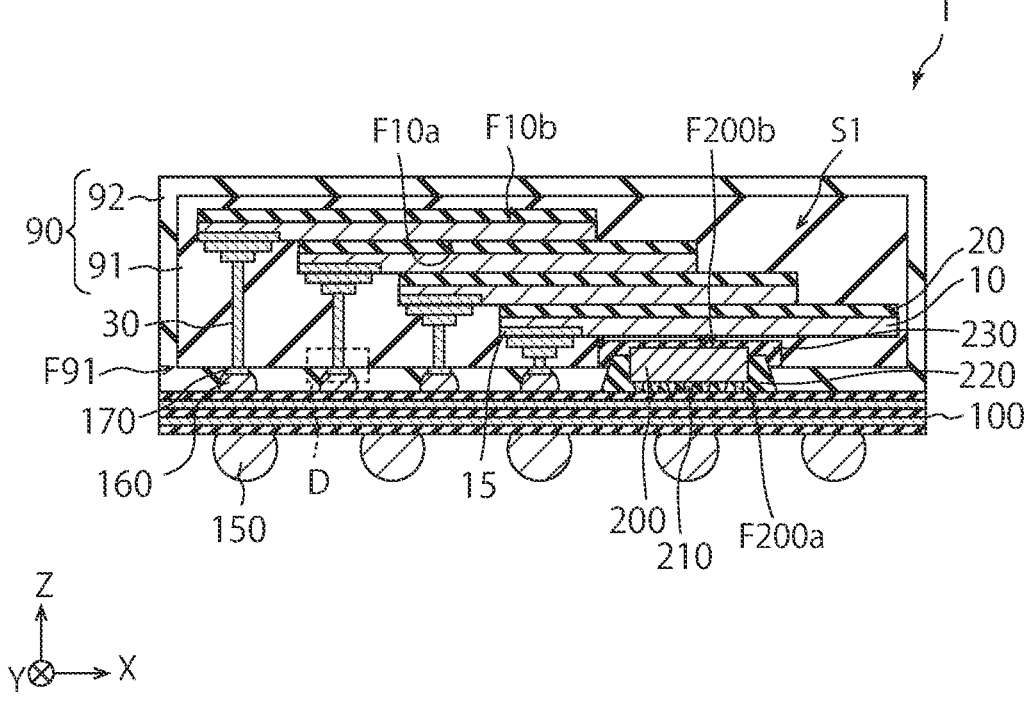
FIG. 1 is a cross sectional view showing an example of a configuration of a semiconductor device according to a first embodiment.

Embodiments will now be explained with reference to the accompanying drawings. The present invention is not limited to the embodiments. It should be noted that the drawings are schematic or conceptual, and the relationship between the thickness and the width in each element and the ratio among the dimensions of elements do not necessarily match the actual ones. Even if two or more drawings show the same portion, the dimensions and the ratio of the portion may differ in each drawing. In the present specification and the drawings, elements identical to those described in the foregoing drawings are denoted by like reference characters and detailed explanations thereof are omitted as appropriate.

A semiconductor device according to the present embodiment includes an insulation member, a columnar electrode, a member, and an electrode pad. The insulation member has a first face. The columnar electrode penetrates the insulation member in a direction approximately perpendicular to the first face. The columnar electrode has a columnar electrode member and a first metal layer of at least one layer which covers an outer circumference of the columnar electrode member and which extends until becoming exposed from the first face. The member is provided on the first face and is arranged so as to overlap with at least a part of the first metal layer that is exposed from the first face as viewed from a direction approximately perpendicular to the first face. The electrode pad is provided on the first face so as to cover the member and is electrically connected to the columnar electrode member.

First Embodiment

FIG. 1 is a cross sectional view showing an example of a configuration of a semiconductor device 1 according to a first embodiment. The semiconductor device 1 includes a stacked body S1, a columnar electrode 30, a metal bump 160, an electrode pad 170, a resin layer 90, a semiconductor chip 200, a metal bump 210, underfill 220, an adhesive 230, a wiring substrate 100, and a metal bump 150. For example, the semiconductor device 1 may be a semiconductor package such as a NAND flash memory or an LSI (Large Scale Integration).

The stacked body S1 is provided above the wiring substrate 100. The stacked body S1 has a semiconductor chip 10 and an adhesion layer 20. For example, the adhesion layer 20 is a DAF (Die Attachment Film). The stacked body S1 is a stacked body in which a plurality of semiconductor chips 10 are stacked so as to be displaced in a direction perpendicular to a stacking direction.

Each of the plurality of semiconductor chips 10 has a first face F10$a$ and a second face F10$b$ on an opposite side to the first face F10$a$. A semiconductor element (not illustrated) such as a memory cell array, a transistor, or a capacitor is formed on the first face F10$a$ of each semiconductor chip 10. The semiconductor element on the first face F10$a$ of the semiconductor chip 10 is covered and protected by an insulator film (not illustrated). For example, an inorganic insulation material such as a silicon oxide film or a silicon nitride film is used as the insulator film. In addition, a material created by forming an organic insulation material on an inorganic insulation material may be used as the insulator film. For example, as the organic insulation material, resins such as a phenolic resin, a polyimide resin, a polyamide resin, an acrylic resin, an epoxy resin, a PBO (p-phenylenebenzobisoxazole) resin, a silicone resin, or a benzocyclobutene resin, or a mixed material, a composite material, and the like of the same is used. For example, the semiconductor chip 10 may be a memory chip of a NAND flash memory or a semiconductor chip provided with any LSI mounted thereon. The semiconductor chips 10 may be semiconductor chips having a same configuration or semiconductor chips having configurations that differ from one another.

The plurality of semiconductor chips 10 are stacked and bonded by the adhesion layer 20. For example, as the adhesion layer 20, organic insulation materials or resins such as a phenolic resin, a polyimide resin, a polyamide resin, an acrylic resin, an epoxy resin, a PBO (p-phenylenebenzo-bisoxazole) resin, a silicone resin, or a benzocyclobutene resin, or a mixed material, a composite material, and the like of the same is used. Each of the plurality of semiconductor chips 10 has an electrode pad 15 that is exposed on the first face F10$a$. Another semiconductor chip 10 (a lower semiconductor chip 10) that is stacked under a given semiconductor chip 10 (an upper semiconductor chip 10) is stacked so as to be displaced in a direction (X direction) that is approximately perpendicular to a side where the electrode pad 15 of the upper semiconductor chip 10 is provided so as not to overlap with the electrode pad 15 of the upper semiconductor chip 10.

The electrode pad 15 is electrically connected to any of the semiconductor elements provided on the semiconductor chip 10. For example, as the electrode pad 15, a low-resistance metal including a single-component metal such as Cu, Ni, W, Au, Ag, Pd, Sn, Bi, Zn, Cr, Al, Ti, Ta, TiN, TaN, or CrN, a composite film made up of two or more of these metals, or an alloy made up of two or more of these metals is used. The columnar electrode 30 is connected to the electrode pad 15 of the semiconductor chip 10 and extends in a stacking direction (Z direction) of the plurality of semiconductor chips 10. The adhesion layer 20 is partially removed to expose a part of the electrode pad 15 and the columnar electrode 30 can be connected to the electrode pad 15. Alternatively, the adhesion layer 20 is pasted to the second face F10b of the lower semiconductor chip 10 and provided so as not to overlap with the electrode pad 15 of the upper semiconductor chip 10. An upper end of the columnar electrode 30 is connected to the electrode pad 15 by, for example, wire bonding. A lower end of the columnar electrode 30 reaches a lower face of a resin layer 91 and is exposed on the lower face. The lower end of the columnar electrode 30 is connected to an electrode pad (not illustrated) of the wiring substrate 100. As a material of the columnar electrode 30, for example, a conductive metal such as Au, Cu, Ag, Pd, or Pt or an alloy containing at least one of these metals is used.

The metal bump 160 is provided on an electrode pad (not illustrated) of the wiring substrate 100. As the metal bump 160, for example, a single-component metal such as Sn, Ag, Cu, Au, Pd, Bi, Zn, Ni, Sb, In, or Ge, a composite film made up of two or more of these metals, or an alloy made up of two or more of these metals is used.

The electrode pad 170 is provided on a lower face of the resin layer 91. The electrode pad 170 is electrically connected to the columnar electrode 30. The electrode pad 170 electrically connects the columnar electrode 30 and the metal bump 160 to each other. Details of the connection between the electrode pad 170 and the columnar electrode 30 will be described later with reference to FIG. 2.

The resin layer 90 covers (seals) the stacked body S1, the columnar electrode 30, the metal bump 160, and the like.

For example, as the resin layer 90, organic insulation materials or resins such as a phenolic resin, a polyimide resin, a polyamide resin, an acrylic resin, an epoxy resin, a PBO (p-phenylenebenzobisoxazole) resin, a silicone resin, or a benzocyclobutene resin, or a mixed material, a composite material, and the like of the same is used.

The resin layer 90 has resin layers 91 and 92.

The resin layer 91 has a face F91 that opposes the wiring substrate 100. The resin layer 91 covers the stacked body S1 and the columnar electrode 30. The face F91 that is a lower face of the resin layer 91 is provided with the electrode pad 170 to be connected to the lower end of the columnar electrode 30.

The resin layer 92 is provided so as to fill a space between the resin layer 91 and the wiring substrate 100 and to cover the resin layer 91.

The resin layer 91 and the resin layer 92 may share a same material or characteristics. Alternatively, materials or characteristics of the resin layer 91 and the resin layer 92 may differ from each other. For example, at least one of a cure shrinkage ratio, a modulus of elasticity, a coefficient of linear expansion, and a glass-transition temperature (Tg) differs between the resin layer 91 and the resin layer 92. A so-called mold resin may be used in the resin layer 91 and the resin layer 92. In a mold resin, a filler of an inorganic insulator is mixed into a resin layer. A mixing ratio between a filler and a resin, a material of the filler, a shape of the filler, a diameter of the filler, and the like may differ between the resin layer 91 and the resin layer 92.

The semiconductor chip 200 has a first face F200a and a second face F200b on an opposite side to the first face F200a. A semiconductor element (not illustrated) such as a transistor, a capacitor, or the like is formed on the first face F200a of each semiconductor chip 200. The semiconductor element on the first face F200a of the semiconductor chip 200 is covered and protected by an insulator film (not illustrated). For example, an inorganic insulation material such as a silicon oxide film or a silicon nitride film is used as the insulator film. In addition, a material created by forming an organic insulation material on an inorganic insulation material may be used as the insulator film. For example, as the organic insulation material, resins such as a phenolic resin, a polyimide resin, a polyamide resin, an acrylic resin, an epoxy resin, a PBO (p-phenylenebenzobisoxazole) resin, a silicone resin, or a benzocyclobutene resin, or a mixed material, a composite material, and the like of the same is used. For example, the semiconductor chip 200 may be a controller chip that controls a memory chip (the semiconductor chip 10) or a semiconductor chip provided with any LSI mounted thereon.

The semiconductor chip 200 is provided on the wiring substrate 100. The semiconductor chip 200 has the metal bump 210 on the first face F200a.

The metal bump 210 is connected to an electrode pad (not illustrated) of the semiconductor chip 200. The metal bump 210 is connected to an electrode pad (not illustrated) of the wiring substrate 100.

The underfill 220 is provided so as to fill a space between the semiconductor chip 200 and the wiring substrate 100 and covers and protects a periphery of the metal bump 210.

The adhesive 230 is provided between the resin layer 91 and the semiconductor chip 200.

The wiring substrate 100 is a multi-layer substrate including a wiring layer and an insulation layer. For example, the insulation layer is a prepreg. For example, the insulation layer is made of a composite material of a fibrous reinforcement material such as a glass cloth and a thermoset resin such as epoxy.

The metal bump 150 is provided under the wiring substrate 100 and electrically connected to the wiring layer of the wiring substrate 100. The metal bump 150 is used for a connection with an external apparatus (not illustrated). As the metal bump 150, for example, a single-component metal such as Sn, Ag, Cu, Au, Pd, Bi, Zn, Ni, Sb, In, or Ge, a composite film made up of two or more of these metals, or an alloy made up of two or more of these metals is used.

Next, details of the connection between the electrode pad 170 and the columnar electrode 30 will be described. In addition, hereinafter, a −Z direction will be considered an upward direction.

Figure 2:
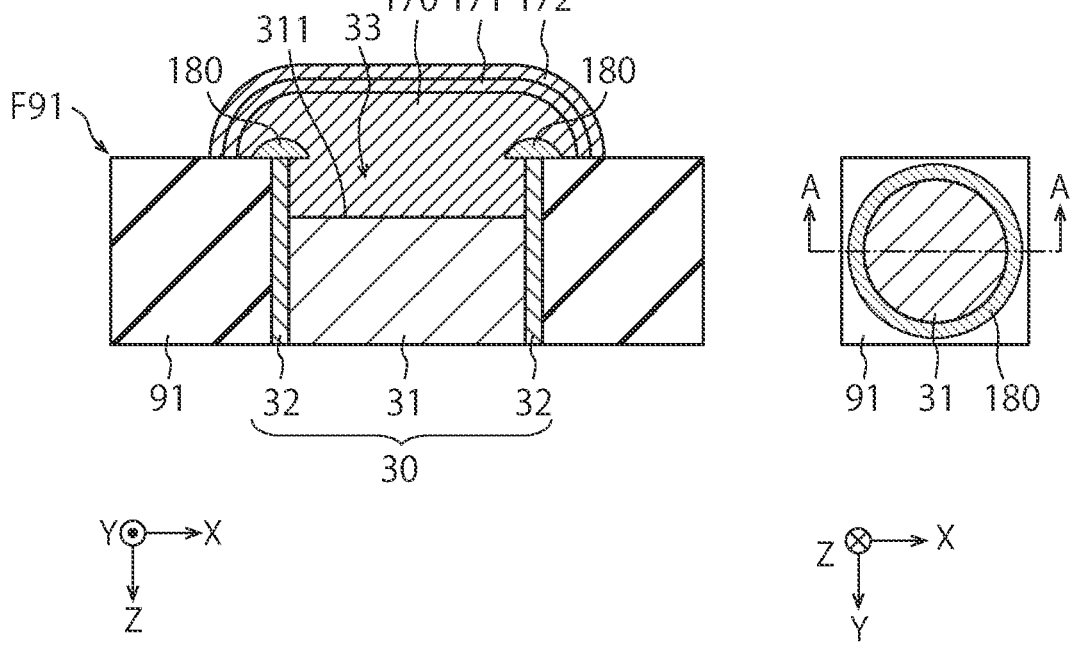
FIG. 2 is a diagram showing an example of a configuration of an electrode pad and a columnar electrode according to the first embodiment.

FIG. 2 is a diagram showing an example of a configuration of the electrode pad 170 and the columnar electrode 30 according to the first embodiment. A left side in FIG. 2 is a cross sectional view of an enlargement of the electrode pad 170 inside a dashed line frame shown in FIG. 1 and a periphery thereof. Note that the cross sectional view in FIG. 2 represents a vertical inversion of FIG. 1. A right side in FIG. 2 is a top view showing a periphery of the electrode pad 170 as viewed from the −Z direction. Note that the electrode pad 170 and the metal layers 171 and 172 are omitted in the top view in FIG. 2. In addition, the cross sectional view in FIG. 2 is a cross sectional view that corresponds to a cross section taken along line A-A in the top view shown in FIG. 2.

The columnar electrode (wire) 30 penetrates the resin layer 91 in a direction (Z direction) approximately perpendicular to the face F91 in the periphery of the face F91. An outer circumference of the columnar electrode 30 as viewed from a direction approximately perpendicular to the face F91 is exposed from the face F91. In addition, the columnar electrode 30 has a depression 33 at an upper end thereof. In other words, the columnar electrode 30 has the depression 33 that is recessed from the face F91 at a center of the columnar electrode 30 as viewed from a direction approximately perpendicular to the face F91. For example, a depth of the depression 33 is approximately 5 μm. The outer circumference of the columnar electrode 30 corresponds to a metal layer 32 to be described later. In addition, the center of the columnar electrode 30 corresponds to a columnar electrode member 31 to be described later.

The columnar electrode 30 has the columnar electrode member 31 and the metal layer 32. The depression 33 of the columnar electrode 30 has a side surface being the metal layer 32 and a bottom being the columnar electrode member 31.

The columnar electrode member (wire member) 31 has an end 311 inside the resin layer 91. In other words, the columnar electrode member 31 terminates inside the resin layer 91. As a material of the columnar electrode member 31, for example, a conductive metal such as Au, Cu, Ag, Pd, Pt, or Ni or an alloy containing at least one of these metals is used. Hereinafter, a case where Cu is used as the material of the columnar electrode member 31 will be described.

The electrode pad 170 extends to the inside of the depression 33 so as to be electrically connected to the columnar electrode member 31. Therefore, a boundary between the columnar electrode member 31 and the electrode pad 170 is positioned inside the resin layer 91. For example, Ni, Cu, or the like is used as a material of the electrode pad 170. Hereinafter, a case where Ni is used as the material of the electrode pad 170 will be described.

The metal layer (a first metal layer) 32 covers an outer circumference of the columnar electrode member 31. Note that the outer circumference of the columnar electrode member 31 is an outer circumference as viewed from an extending direction of the columnar electrode member 31 (Z direction). The metal layer 32 extends in the −Z direction until the metal layer 32 becomes exposed from the face F91. The metal layer 32 protects the columnar electrode member 31 from oxidation and the like. Accordingly, the columnar electrode member 31 can be more readily handled. For example, a precious metal such as Pd, Au, Ag, or Pt is used as a material of the metal layer 32. Hereinafter, a case where Pd is used as the material of the metal layer 32 will be described.

As described above, the electrode pad 170 extends to the inside of the depression 33 that is provided by recessing of the columnar electrode member 31. Accordingly, a strength of the electrode pad 170 can be improved by an anchor effect. As a result, connection reliability of the electrode pad 170 can be improved. In addition, as will be described later, the strength of the electrode pad 170 can also be improved by forming the depression 33 so as to remove a grinding mark and a region of influence of machining of the columnar electrode member 31.

However, providing the depression 33 may possibly destabilize the metal layer 32 and cause the metal layer 32 to peel away and fall inside the depression 33.

In consideration thereof, the semiconductor device 1 further includes a member 180. The member 180 is provided so as to fix the metal layer 32.

The member 180 is provided on the face F91. The member 180 is arranged so as to overlap with at least a part of the outer circumference of the columnar electrode 30 as viewed from a direction approximately perpendicular to the first face F91. More specifically, the member 180 is arranged so as to overlap with at least a part of the metal layer 32 that is exposed from the face F91 as viewed from a direction approximately perpendicular to the face F91. In the example shown in the top view in FIG. 2, the member 180 is arranged in, for example, an approximately annular shape.

In addition, the member 180 is arranged so as not to overlap with at least a part of the columnar electrode 30 as viewed from a direction approximately perpendicular to the face F91. In other words, the member 180 is arranged so as not to completely block the columnar electrode 30.

For example, a metal such as Ni, Co, Au, Ag, Pd, Rh, Pt, In, or Sn or an alloy made up of two or more of these metals is used as a material of the member 180. The material of the member 180 preferably differs from the material of the columnar electrode member 31 so as not to be removed by etching of the columnar electrode member 31 in a step to be described later with reference to FIG. 3C. Hereinafter, a case where Ni is used as the material of the member 180 will be described.

For example, an organic substance such as PI (Polyimide) may also be used as the material of the member 180. For example, using photosensitive PI enables the member 180 to be formed by lithography.

The electrode pad 170 is provided on the face F91 so as to cover the member 180.

The semiconductor device 1 further includes at least one metal layer (a second metal layer) that covers the electrode pad 170. More specifically, the semiconductor device 1 further includes the metal layers 171 and 172.

For example, a precious metal such as Au or Pd is used as a material of the metal layers 171 and 172. Accordingly, the electrode pad 170 can be protected. Hereinafter, a case where Pd is used as the material of the metal layer 171 and Au is used as the material of the metal layer 172 will be described.

Alternatively, for example, a low-melting-point metal such as In or Sn may be used as the materials of the metal layers 171 and 172. Accordingly, the electrode pad 170 can be more readily connected to the metal bump 160.

Next, a method of forming the electrode pad 170 and the member 180 will be described.

FIGS. 3A to 3E are diagrams showing an example of a manufacturing method of the semiconductor device 1 according to the first embodiment. In a similar manner to the left side of FIG. 2, the left sides of FIGS. 3A to 3E represent cross sectional views. In a similar manner to the right side of FIG. 2, the right sides of FIGS. 3A to 3D represent top views.

Figure 3A:
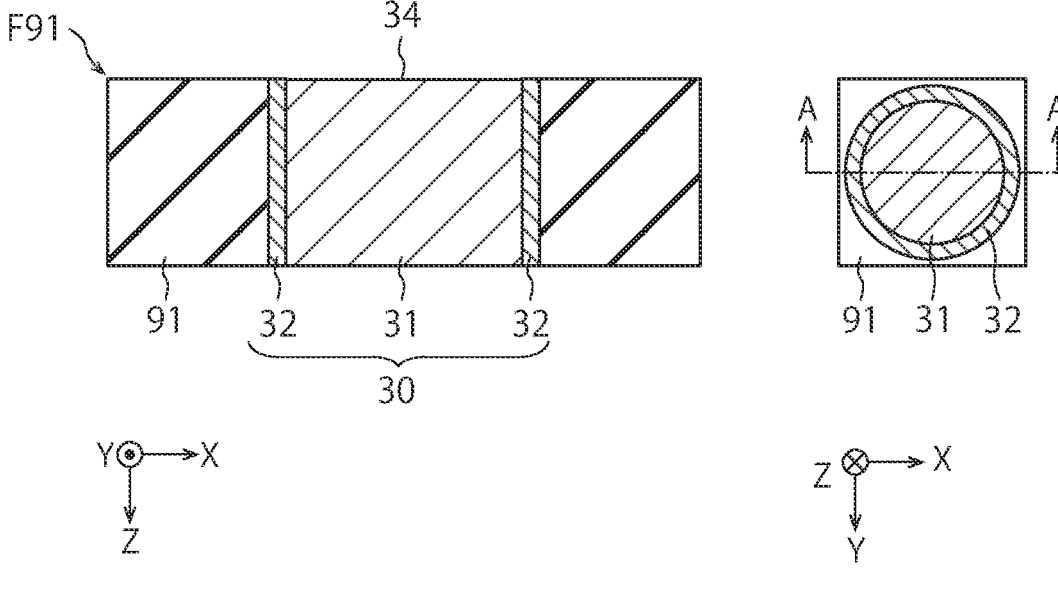
FIG. 3A is a diagram showing an example of a manufacturing method of a semiconductor device according to the first embodiment.

First, as shown in FIG. 3A, the columnar electrode 30 having the columnar electrode member 31 and the metal layer 32 is formed, the resin layer 91 to cover the columnar electrode 30 is formed, and the resin layer 91 is polished so that an upper end 34 of the columnar electrode 30 is exposed from the face F91. While polishing of the resin layer 91 is performed by, for example, mechanical polishing, the polishing may also be performed by CMP (Chemical Mechanical Polishing) or the like.

Figure 3B:
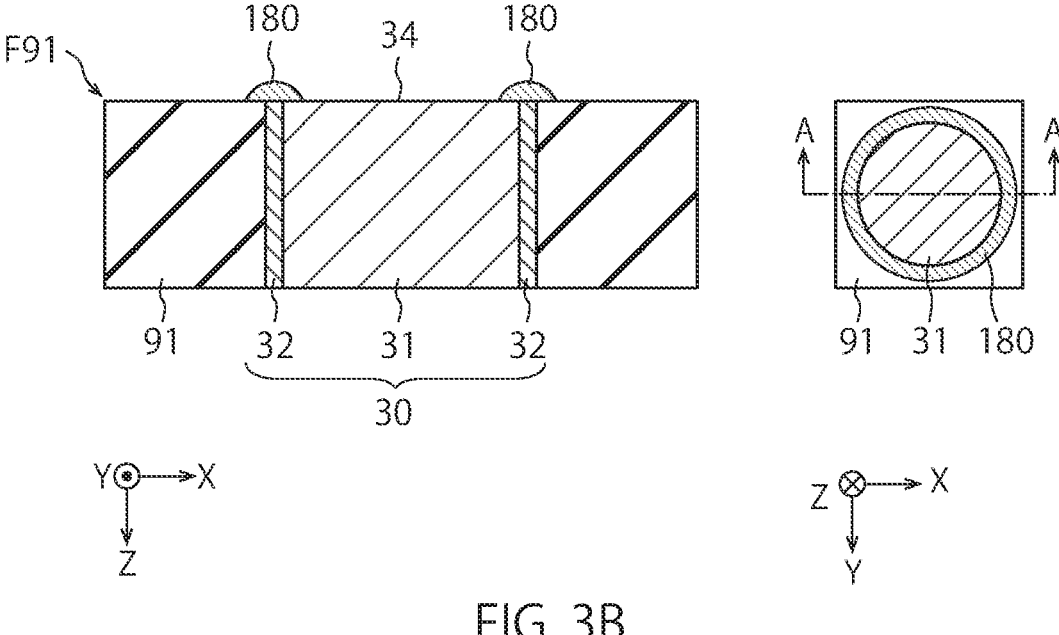
FIG. 3B is a diagram showing an example of a manufacturing method of a semiconductor device that is a continuation of FIG. 3A.

Next, as shown in FIG. 3B, the member 180 is formed on the face F91. The member 180 is formed so as to overlap with at least a part of the metal layer 32 that is exposed from the face F91 as viewed from a direction approximately perpendicular to the face F91. For example, the member 180 is formed by electroless plating.

Ni of the member 180 is deposited by, for example, electroless plating using Pd of the metal layer 32 as a catalyst. Subsequently, with the deposited Ni as an autocatalyst, Ni is deposited. Accordingly, when viewed from a direction approximately perpendicular to the face F91, the member 180 is formed at an entire position of the metal layer 32. In the example shown in the top view in FIG. 3B, the member 180 is formed in, for example, an approximately annular shape.

Figure 3C:
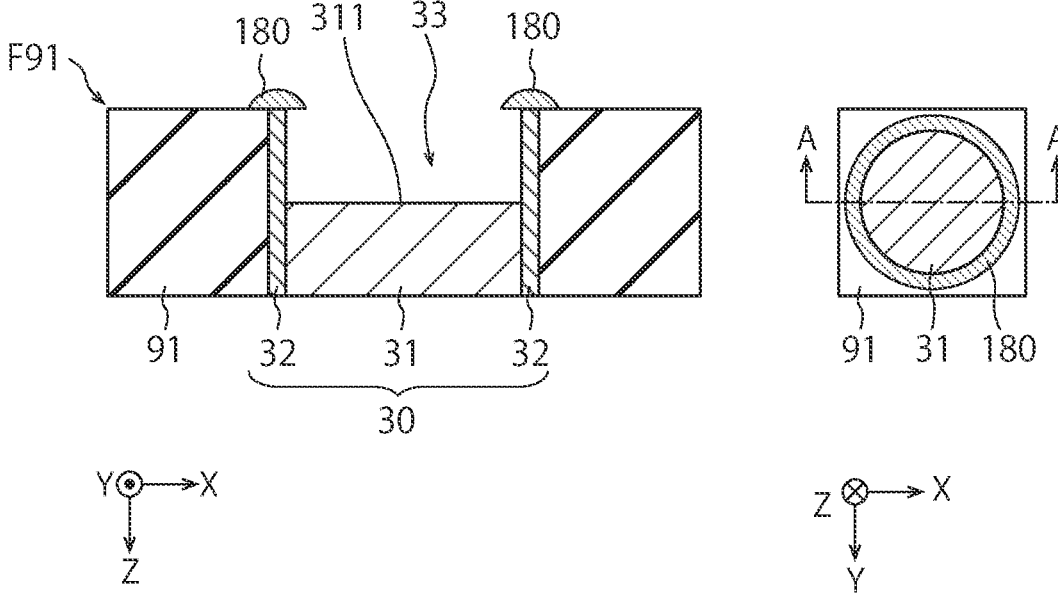
FIG. 3C is a diagram showing an example of a manufacturing method of a semiconductor device that is a continuation of FIG. 3B.

Next, as shown in FIG. 3C, the depression 33 is formed by removing a part of the columnar electrode member 31. More specifically, by removing a part of the columnar electrode member 31 from a side of the face F91, the depression 33 having a side face being the metal layer 32 and a bottom being the columnar electrode member 31 is formed at the upper end 34 of the columnar electrode 30. For example, the depression 33 is formed by etching. The bottom of the depression 33 constitutes the end 311 of the columnar electrode member 31.

Figure 3D:
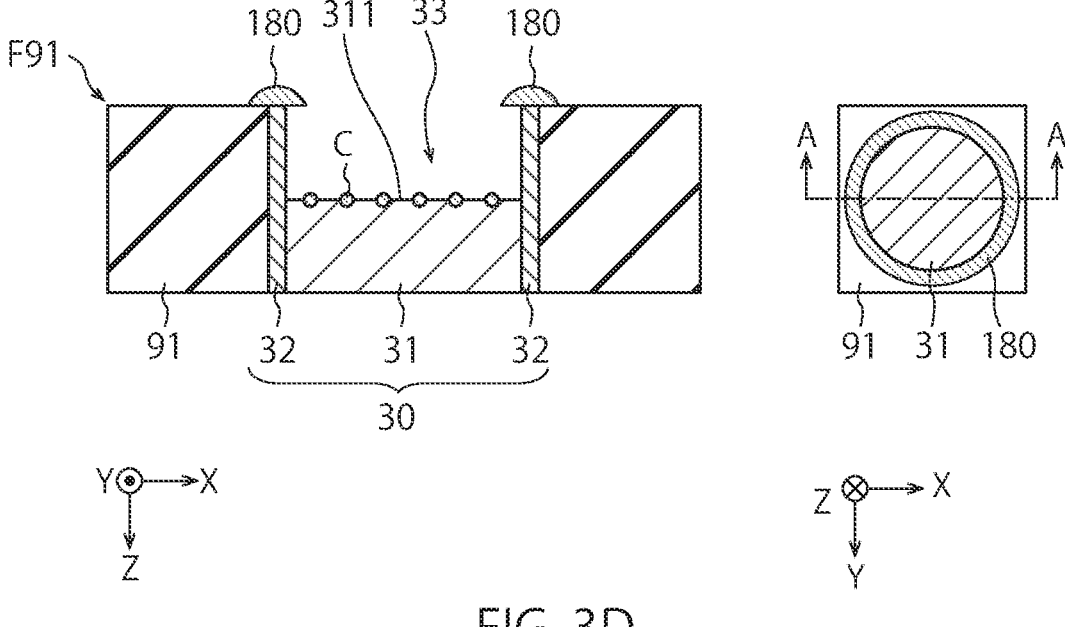
FIG. 3D is a diagram showing an example of a manufacturing method of a semiconductor device that is a continuation of FIG. 3C.

Next, as shown in FIG. 3D, a catalyst C is added onto the bottom of the depression 33 or, in other words, onto the end 311 of the columnar electrode member 31. The catalyst C is adsorbed to the top face of the end 311. For example, the catalyst C is a Pd catalyst.

Figure 3E:
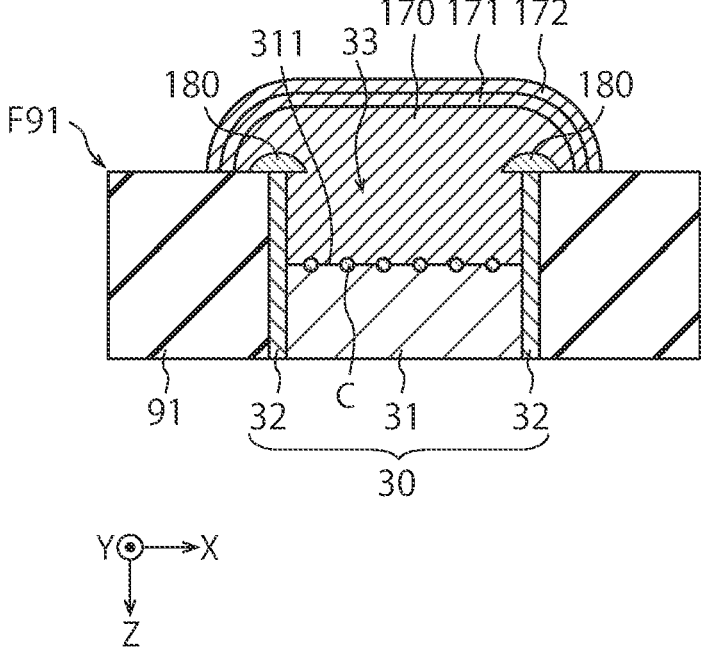
FIG. 3E is a diagram showing an example of a manufacturing method of a semiconductor device that is a continuation of FIG. 3D.

Next, as shown in FIG. 3E, the electrode pad 170 to be electrically connected to the columnar electrode 30 is formed inside the depression 33 and on the member 180. In addition, the metal layer 171 that covers the electrode pad 170 is formed and the metal layer 172 that covers the metal layer 171 is formed. For example, the electrode pad 170 and the metal layers 171 and 172 are formed by electroless plating. Ni of the electrode pad 170 is deposited with Ni of the member 180 as an autocatalyst and deposited with Pd of the metal layer 32 and the catalyst C as catalysts.

Next, improvement of strength of the electrode pad 170 by formation of the depression 33 will be described.

In the step shown in FIG. 3A, irregularities due to a grinding mark are formed on a surface of the upper end 34 of the columnar electrode 30. The catalyst C for forming the electrode pad 170 is readily adsorbed to protrusions of the grinding mark. In this case, during the formation of the electrode pad 170, a large number of small voids may possibly be created in a depression of the grinding mark (an interface between the columnar electrode member 31 and the electrode pad 170). Voids cause a decline in connection reliability of the electrode pad 170. By forming the depression 33 in the step shown in FIG. 3C, irregularities due to the grinding mark are removed and a surface of the end 311 with a relatively small amount of irregularities is exposed. Accordingly, a state of the interface between the columnar electrode member 31 and the electrode pad 170 can be improved and the connection reliability of the electrode pad 170 can be improved.

In addition, in the step shown in FIG. 3A, a region of influence of machining with a thickness of around, for example, several μm is formed at the upper end 34 of the columnar electrode 30. The region of influence of machining is a region in which crystals have become smaller or crystals have become distorted. Due to distortion or the like of the crystals, an etching rate increases. Therefore, in the region of influence of machining, etching of the columnar electrode member 31 shown in FIG. 3C is not uniformly performed and irregularities are likely to be created on the surface of the columnar electrode member 31. In this case, a large number of small voids may possibly be created in an interface between the columnar electrode member 31 and the electrode pad 170. Voids cause a decline in connection reliability of the electrode pad 170. Therefore, by forming the depression 33 by etching so as to include a region in which crystals are hardly distorted, the region of influence of machining is entirely removed and the surface of the end 311 with a relatively small amount of irregularities is exposed. Accordingly, a state of the interface between the columnar electrode member 31 and the electrode pad 170 can be improved and the connection reliability of the electrode pad 170 can be improved.

In addition to the anchor effect, by forming the depression 33, the grinding mark and the region of influence of machining are removed and the strength of the electrode pad 170 can be improved. Accordingly, the connection reliability of the electrode pad 170 can be improved.

As described above, according to the first embodiment, the member 180 is provided on the face F91 and arranged so as to overlap with at least a part of the metal layer 32 that is exposed from the face F91 as viewed from a direction approximately perpendicular to the face F91. The metal layer 32 can be fixed by the member 180 and peeling of the metal layer 32 inside the depression 33 can be suppressed. Accordingly, the connection reliability of the electrode pad 170 can be improved.

In addition, in the first embodiment, the electrode pad 170 extends into the depression 33 so as to be electrically connected to the columnar electrode member 31. The strength of the electrode pad 170 can be improved by an anchor effect and by the removal of a grinding mark and a region of influence of machining of the columnar electrode member 31. Accordingly, the connection reliability of the electrode pad 170 can be improved.

In addition, the example shown in FIG. 2 presents the metal layer 32 that is a single layer. The metal layer 32 may be provided as at least one layer. Therefore, the metal layer 32 of two or more layers may be provided.

As described above, for example, a material of the resin layer 91 is an organic substance containing a filler. The organic substance of the resin layer 91 is, for example, a mold resin, an epoxy resin, PI, or the like. However, a material of the resin layer 91 as an insulation member may be, for example, an inorganic substance such as $SiO_2$. In addition, the resin layer (insulation member) 91 may have a plurality of resin layers (a plurality of insulation members) of different materials or with different characteristics. Accordingly, warpage of a package of the semiconductor device 1 can be suppressed. Among the plurality of insulation members, for example, at least one of a cure shrinkage ratio, a modulus of elasticity, a coefficient of linear expansion, and a glass-transition temperature (Tg) differs. In addition, a so-called mold resin may be used in the resin layer 91. In a mold resin, a filler of an inorganic insulator is mixed into a resin layer. Among the plurality of resin layers in the resin layer 91, a mixing ratio between a filler and a resin, a material of the filler, a shape of the filler, a diameter of the filler, or the like may differ.

Second Embodiment

Figure 4:
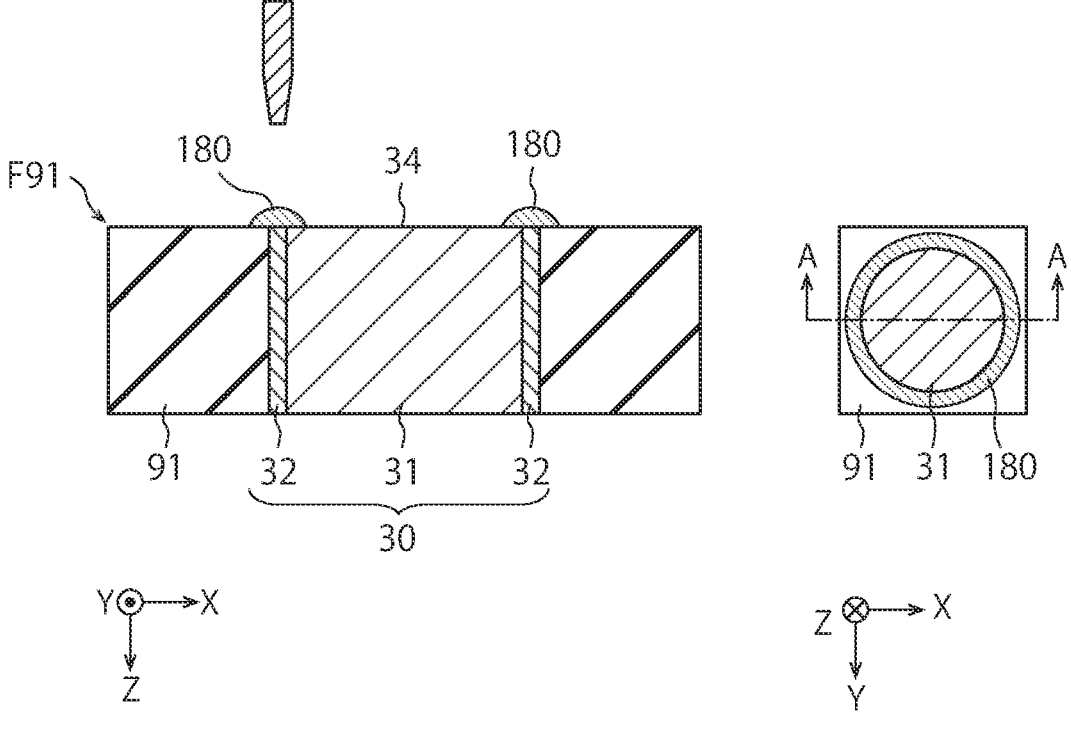
FIG. 4 is a diagram showing an example of a configuration of a semiconductor device according to a second embodiment.

FIG. 4 is a diagram showing an example of a manufacturing method of the semiconductor device 1 according to the second embodiment. The second embodiment differs from the first embodiment in a formation method of the member 180.

After exposing the upper end 34 of the columnar electrode 30 (refer to FIG. 3A), the member 180 is formed on the face F91 as shown in FIG. 4. For example, the member 180 is formed by an ink-jet method. In this case, the member 180 may be formed one location at a time or may be formed at a plurality of locations all at once. Note that the member 180 is not limited to electroless plating according to the first embodiment or the ink-jet method according to the second embodiment and may be formed by other methods such as printing.

Subsequently, similar steps to the steps shown in FIGS. 3C to 3E are performed.

The member 180 need not necessarily be arranged so as to overlap (in an approximately annular shape) with an entirety of the metal layer 32. The member 180 may be arranged so as to overlap with at least a part of the metal layer 32 that is exposed from the face F91 as viewed from a direction approximately perpendicular to the face F91 so as to enable peeling of the metal layer 32 to be suppressed.

The formation method of the member 180 may be changed as in the second embodiment. The semiconductor device 1 according to the second embodiment is capable of producing a similar effect to the first embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device, comprising:
an insulation member having a first face;
a columnar electrode penetrating the insulation member in a direction approximately perpendicular to the first face, the columnar electrode having a columnar electrode member and a first metal layer of at least one layer which covers an outer circumference of the columnar electrode member and which extends until becoming exposed from the first face;
a member which is provided on the first face and which is arranged so as to overlap with at least a part of the first metal layer that is exposed from the first face as viewed from a direction approximately perpendicular to the first face; and
an electrode pad which is provided on the first face so as to cover the member and which is electrically connected to the columnar electrode member,
wherein the member is annular in shape as viewed from the direction,
an outer diameter of the member is smaller than an outer diameter of the electrode pad,
the columnar electrode includes, at an upper end thereof, a depression having a side face being the first metal layer and a bottom being the columnar electrode member, and
the electrode pad extends to an inside of the depression so as to be electrically connected to the columnar electrode member.

2. A semiconductor device, comprising:
an insulation member having a first face;
a columnar electrode penetrating the insulation member in a direction approximately perpendicular to the first face, the columnar electrode having a columnar electrode member and a first metal layer of at least one layer which covers an outer circumference of the columnar electrode member and which extends until becoming exposed from the first face;
a member which is provided on the first face and which is arranged so as to overlap with at least a part of the first metal layer that is exposed from the first face as viewed from a direction approximately perpendicular to the first face; and
an electrode pad which is provided on the first face so as to cover the member and which is electrically connected to the columnar electrode member,
wherein the member is annular in shape as viewed from the direction,
an outer diameter of the member is smaller than an outer diameter of the electrode pad, and
the member is arranged so as not to overlap with at least a part of the columnar electrode as viewed from a direction approximately perpendicular to the first face.

3. The semiconductor device according to claim 1, wherein
a material of the member differs from a material of the columnar electrode member.

4. The semiconductor device according to claim 1, wherein
a metal or an organic substance is used as a material of the member.

5. The semiconductor device according to claim 4, wherein
a metal as a material of the member includes Ni, Co, Au, Ag, Pd, Rh, Pt, In, or Sn, and
an organic substance as a material of the member includes PI (Polyimide).

6. The semiconductor device according to claim 1, wherein
an organic substance including a filler or an inorganic substance is used as a material of the insulation member.

7. The semiconductor device according to claim 1, wherein
a precious metal is used as a material of the first metal layer.

8. The semiconductor device according to claim 1, further comprising
a second metal layer of at least one layer that covers the electrode pad.

9. The semiconductor device according to claim 2, wherein
a material of the member differs from a material of the columnar electrode member.

10. The semiconductor device according to claim 2, wherein
a metal or an organic substance is used as a material of the member.

11. The semiconductor device according to claim 10, wherein
a metal as a material of the member includes Ni, Co, Au, Ag, Pd, Rh, Pt, In, or Sn, and
an organic substance as a material of the member includes PI (Polyimide).

12. The semiconductor device according to claim 2, wherein an organic substance including a filler or an inorganic substance is used as a material of the insulation member.

13. The semiconductor device according to claim 2, wherein a precious metal is used as a material of the first metal layer.

14. The semiconductor device according to claim 2, further comprising a second metal layer of at least one layer that covers the electrode pad.

* * * * *